(12) United States Patent
Kim

(10) Patent No.: US 12,204,188 B2
(45) Date of Patent: Jan. 21, 2025

(54) DISPLAY DEVICE

(71) Applicant: LG Display Co., Ltd., Seoul (KR)

(72) Inventor: Han Seok Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/029,523

(22) PCT Filed: Sep. 9, 2021

(86) PCT No.: PCT/KR2021/012269
§ 371 (c)(1),
(2) Date: Mar. 30, 2023

(87) PCT Pub. No.: WO2022/145625
PCT Pub. Date: Jul. 7, 2022

(65) Prior Publication Data
US 2023/0367151 A1    Nov. 16, 2023

(30) Foreign Application Priority Data
Dec. 28, 2020  (KR) .......................... 10-2020-0184186

(51) Int. Cl.
*G02F 1/1333*    (2006.01)
(52) U.S. Cl.
CPC .. *G02F 1/133322* (2021.01); *G02F 1/133331* (2021.01)
(58) Field of Classification Search
CPC ..................... G02F 1/133322; G02F 1/133331
USPC ........................................................ 349/58
See application file for complete search history.

(56) References Cited

U.S. PATENT DOCUMENTS

| 9,081,540 | B1 | 7/2015 | Cho et al. |
| 11,347,267 | B2 * | 5/2022 | Wolff .................... G06F 1/1601 |
| 2008/0313942 | A1 | 12/2008 | Heine |
| 2013/0155655 | A1 | 6/2013 | Lee et al. |
| 2016/0249475 | A1 | 8/2016 | Park |
| 2020/0323087 | A1 * | 10/2020 | Hwang ................ H05K 5/0247 |

FOREIGN PATENT DOCUMENTS

| JP | 2009-509181 A | 3/2009 |
| KR | 10-1523171 B1 | 5/2015 |
| KR | 10-2015-0125140 A | 11/2015 |
| KR | 10-2016-0103600 A | 9/2016 |
| KR | 10-1757226 B1 | 7/2017 |
| KR | 10-2182187 B1 | 11/2020 |

\* cited by examiner

*Primary Examiner* — Dung T Nguyen
*Assistant Examiner* — David Y Chung
(74) *Attorney, Agent, or Firm* — Birch, Stewart, Kolasch & Birch, LLP

(57) ABSTRACT

A display device can include a display panel, a cover shield disposed on a rear surface of the display panel, a curvature control member disposed on an inner side of the cover shield, and rotation members connected to ends of the curvature control member, respectively, and coupling the cover shield with the curvature control member. The curvature control member can be configured to rotate with the rotation members, Further, the cover shield is switched between a first state and a second state as the curvature control member rotates, and the cover shield is configured to be flat in the first state and is configured to be curved with a curvature in the second state. Therefore, the curvature of the display device is easily controlled by a simple structure and operation.

15 Claims, 11 Drawing Sheets

DISPLAY DEVICE

CROSS-REFERENCE TO RELATED APPLICATIONS

This application is the National Stage filing under 35 U.S.C. 371 of International Application No. PCT/KR2021/012269, filed on Sep. 9, 2021, which claims the benefit of earlier filing date and right of priority to Korean Application No. 10-2020-0184186 filed on Dec. 28, 2020, the entire contents of all these applications are hereby expressly incorporated by reference into the present application.

BACKGROUND

Field

The present disclosure relates to a display device, and more particularly, to a display device capable of easily controlling a curvature.

Discussion of the Related Art

As the era of information technology has begun, the field of display devices that represent electrical information signals graphically has been rapidly grown up. In accordance with this, various display devices which are thinner, lighter and consume less power have been developed.

Specifically, a flat-panel display device such as a liquid-crystal display device using light-emitting diodes (LED) as light sources and an organic light-emitting diode (OLED) display device using self-emissive OLEDs, is attracting attention as the next-generation display device because it is thin and consumes less power. In particular, a flexible display device such as a bendable display device, a foldable display device and a rollable display device is recently being developed.

Such display devices find more and more applications, including computer monitors and televisions, as well as personal portable devices. Accordingly, research is ongoing to develop display devices having a larger display area with reduced volume and weight. In particular, a tiled display having a larger display area by connecting a plurality of display devices recently finds many applications.

SUMMARY OF THE DISCLOSURE

Display devices are employed in a small-sized electronic device such as mobile phones, and in a large-sized electronic device such as large TVs. As such, display devices are fabricated from a small size to a large size, e.g., several tens of inches, for a variety of applications. It can be technically challenging to fabricate a display device with a very large size of several hundred inches or more. Instead, a tiled display implemented by connecting a plurality of display devices with one another to increase the display area cam be used.

In addition, a tiled display including a plurality of display devices can be used as a billboard by attaching it to a wall, or can be used as a large billboard in a stadium or an outdoor advertisement billboard.

As the tiled display becomes larger, a curved tiled display becomes more popular than a flat tiled display. However, since each of a plurality of display devices forming the tiling display device has a flat surface, there can be a limitation in that boundary areas between the plurality of display devices can be noticed when a tiled display a curved structure is implemented.

In view of the above, the inventor of the present application has devised a display device capable of easily changing a curvature in order to implement a tiled display. In addition, the inventor of the present application has devised a display device capable of preventing boundary areas between a plurality of display devices from been noticed by making all of the front surfaces of the plurality of display devices form a curved surface.

An object of the present disclosure is to provide a display device capable of easily controlling the curvature by rotating a curvature control member having a simple structure.

Another object of the present disclosure is to provide a tiled display capable of preventing boundary areas between a plurality of display devices from been noticed by making all of the front surfaces of the plurality of display devices form a curved surface.

Objects of the present disclosure are not limited to the above-mentioned objects, and other objects, which are not mentioned above, can be clearly understood by those skilled in the art from the following descriptions.

According to an aspect of the present disclosure, a display device includes a display panel, a cover shield disposed on a rear surface of the display panel, a curvature control member disposed on an inner side of the cover shield and rotation members connected to both ends of the curvature control member, respectively, and coupling the cover shield with the curvature control member, wherein the curvature control member is configured to rotate with the rotation members, and wherein the cover shield is switched between a first state and a second state as the curvature control member rotates, wherein the cover shield is flat in the first state and is curved with a curvature in the second state.

According to an aspect of the present disclosure, a display device includes a display panel, a cover shield disposed on a rear surface of the display panel, a curvature control member disposed on an inner side of the cover shield such that it is disposed at each of an upper portion and a lower portion of the display panel and rotation members connected to both ends of the curvature control member, respectively, and rotating together with the curvature control member, wherein the display panel and the cover shield are switched between a first state and a second state as the curvature control member rotates, wherein the display panel and the cover shield are flat in the first state and are curved with a curvature in the second state.

Other detailed matters of the exemplary embodiments are included in the detailed description and the drawings.

According to an exemplary embodiment of the present disclosure, the curvature of a display device can be easily controlled by a curvature control member, and a tiled display having various curvatures can be implemented.

According to an exemplary embodiment of the present disclosure, the display quality can be improved by suppressing boundary areas of a tiled display from being noticed.

The effects according to the present disclosure are not limited to the contents exemplified above, and more various effects are included in the present specification.

DETAILED DESCRIPTION OF THE EMBODIMENTS

Figure 1A:
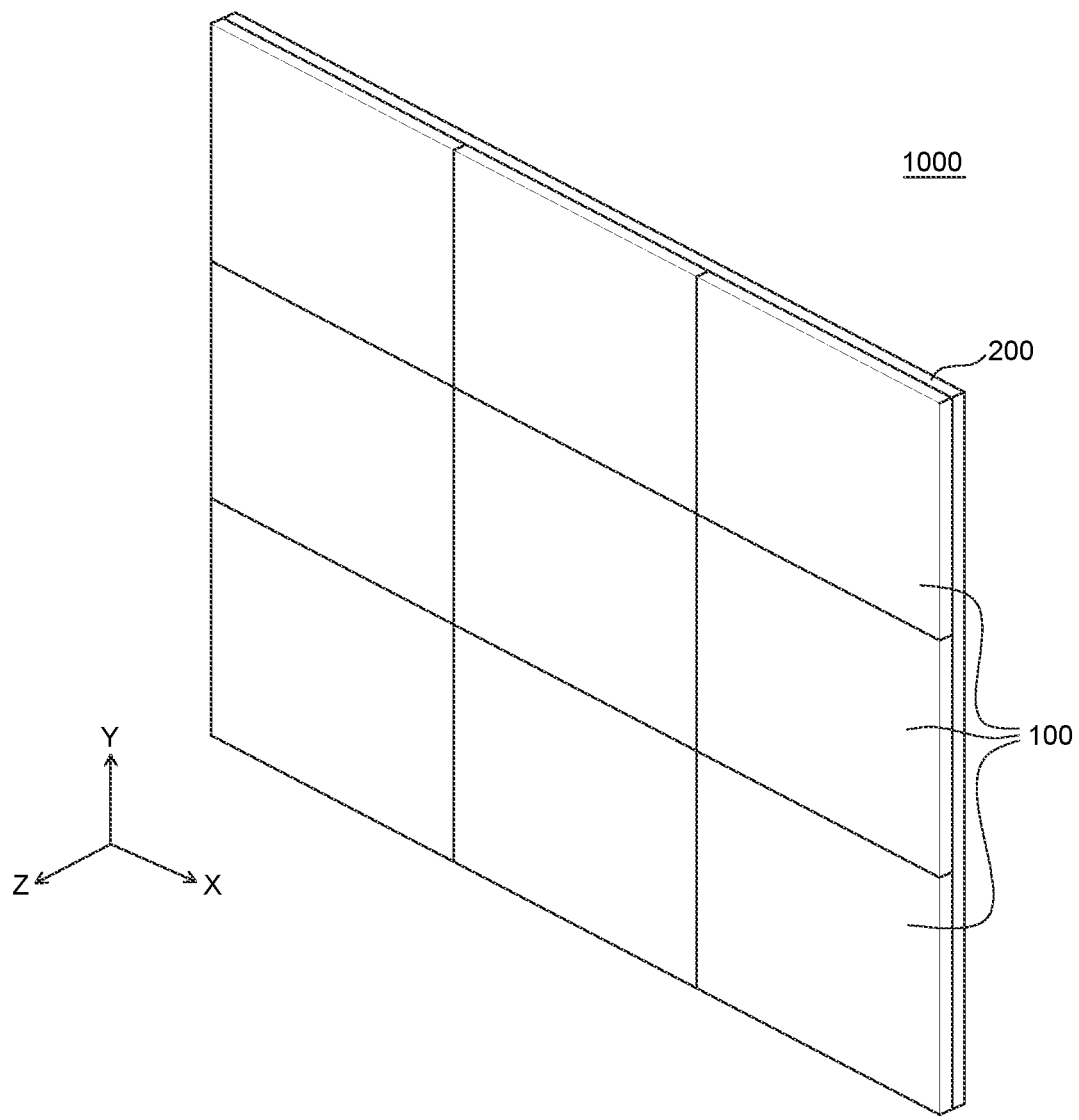
FIGS. 1A and 1B are perspective views of a tiled display according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," and "having" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 1B:
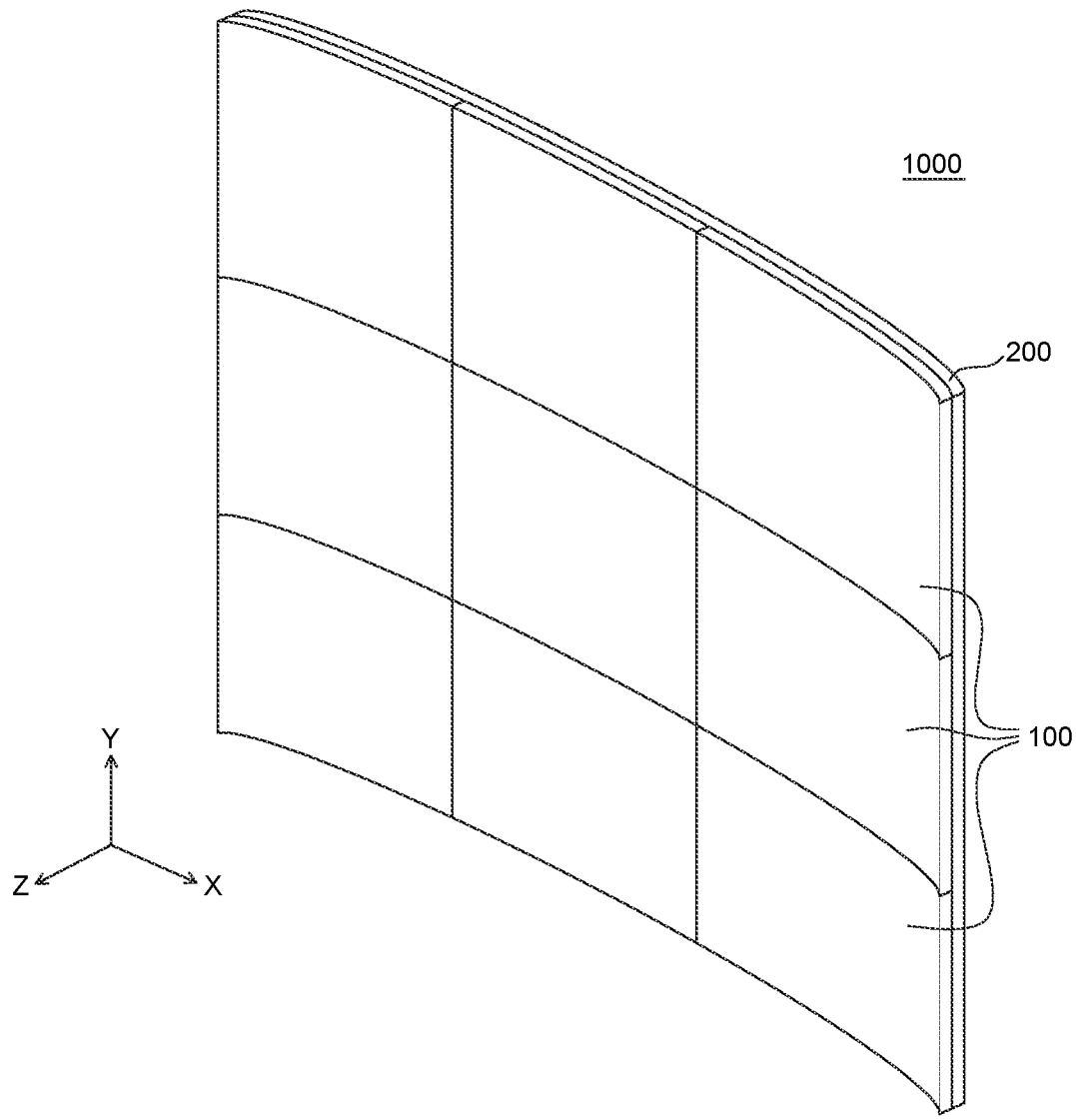

FIGS. 1A and 1B are perspective views of a tiled display according to an exemplary embodiment of the present disclosure.

Referring to FIGS. 1A and 1B, a tiled display 1000 according to the exemplary embodiment of the present disclosure includes a plurality of display devices 100 and a wall part 200. The tiled display 1000 is implemented by connecting the plurality of display devices 100. In other words, the tiled display 1000 is implemented with the plurality of display devices 100, to provide a large display area on which image are displayed.

The plurality of display devices 100 is attached to the wall part 200 and arranged as if they were a single display. For example, the tiled display 1000 can be implemented by attaching the plurality of display devices 100 to the wall part 200 in a tile pattern.

Incidentally, since the tiled display 1000 has a very large size, it is difficult to move it to an installation site after the display devices 100 are connected to it. For this reason, the plurality of display devices 100 can be assembled into the tiled display 1000 after they have been moved to an installation site. The plurality of display devices 100 can be attached together as closely as possible so that the plurality of display devices 100 looks like a single display device. That is to say, the plurality of display devices 100 can be arranged such that the distance between the plurality of display devices 100 is constant and minimized. By precisely aligning the display devices 100 and attaching them to the wall part 200, boundary areas where no image is displayed can be minimized.

The plurality of display devices 100 can be aligned in the x-axis direction, the y-axis direction and the z-axis direction and attached to the wall part 200. When the plurality of display devices 100 is aligned in the x-axis direction, the left edges and the right edges of the display devices 100 arranged in the same column can be aligned so that they are arranged on straight lines, respectively. When the plurality of display devices 100 is aligned in the y-axis direction, the upper edges and the lower edges of the display devices 100 arranged in the same column can be aligned so that they are arranged on straight lines, respectively. When the plurality of display devices 100 is aligned in the z-axis direction, all of the front surfaces of the display devices 100 can be arranged on a single surface without level differences between the plurality of display devices 100.

The tiled display 1000 can be implemented as a flat surface or a curved surface. Specifically, in the example shown in FIG. 1A, the tiled display 1000 can be implemented as a flat-panel display. In this instance, each of the plurality of display devices 100 can be flat. Accordingly, all of the front surfaces of the plurality of display devices 100 can be arranged to form a single plane.

In the example shown in FIG. 1B, the tiled display 1000 is implemented as a curved display device. In this instance, each of the plurality of display devices 100 can be curved.

Accordingly, the entire front surface of the plurality of display devices 100 can be arranged to form a single curved plane. That is to say, the curved surfaces formed by the display devices 100 adjacent to each other can be continuously formed and included in a single curved surface.

Each of the plurality of display devices 100 can be switched between a flat state and a curved state with a curvature depending on the shape of the wall part 200. In the following description, for convenience of illustration, a flat state is defined as a first state, and a curved state with a curvature is defined as a second state. In other words, in the first state, the front surface of the display device 100 can be in a flat state, and in the second state, the front surface of the display device 100 can be in a curved state. The plurality of display devices 100 can be switched between the first state and the second state by curvature control members 180. In addition, in the second state, each of the plurality of display devices 100 can be configured such that its curvature can be varied by the curvature control members 180. The curvature control members 180 will be described later.

Hereinafter, the display device 100 according to an exemplary embodiment of the present disclosure will be described in detail with reference to FIG. 2.

Figure 2:
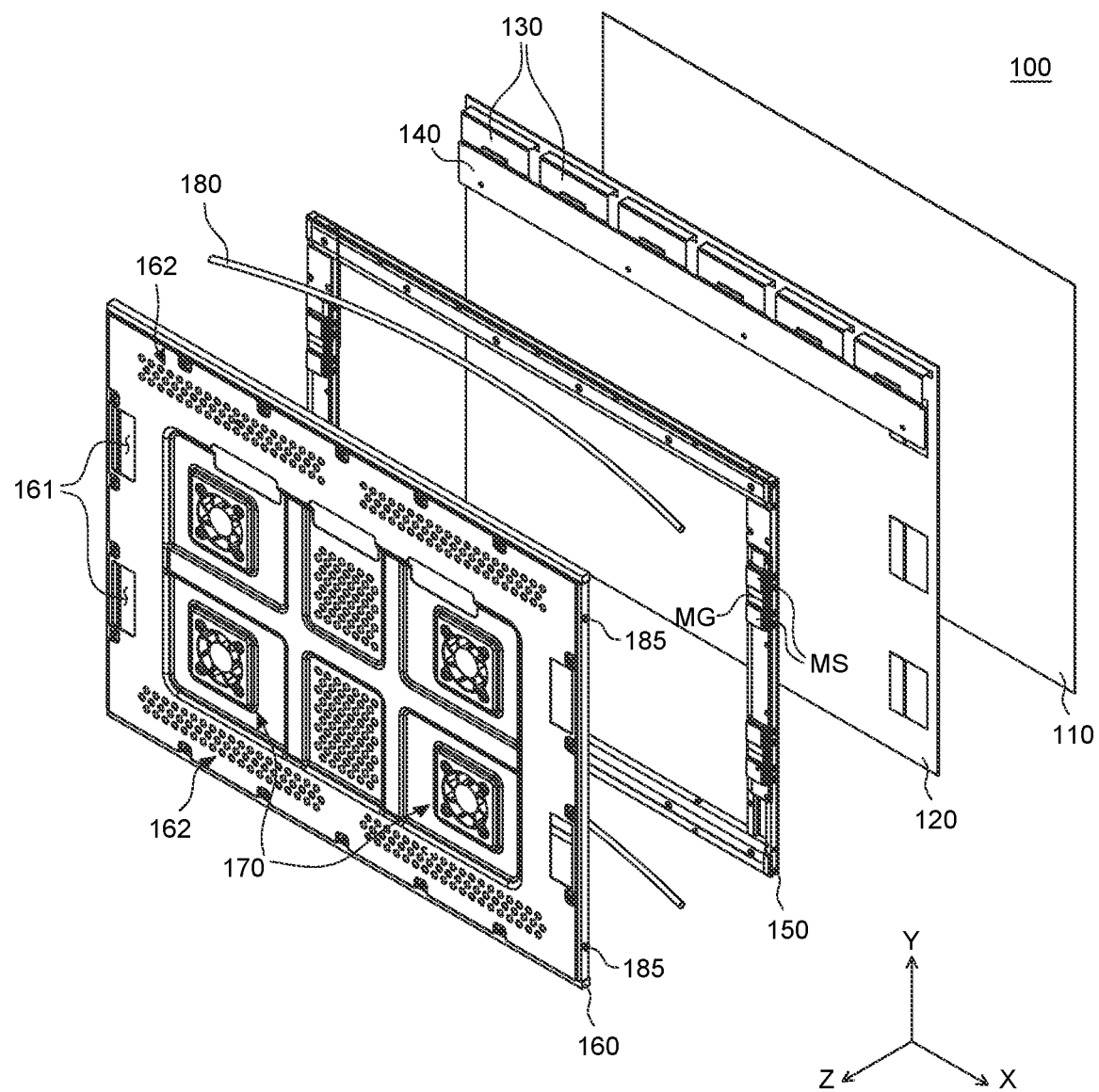
FIG. 2 is an exploded, perspective view of a display device according to an exemplary embodiment of the present disclosure.

FIG. 2 is an exploded, perspective view of a display device according to an exemplary embodiment of the present disclosure. Specifically, the exploded, perspective view of FIG. 2 is viewed from the rear side of the display device 100. The front surface of the display device 100 can refer to the side on which a protection plate 110 is disposed, and the rear surface thereof can refer to the side on which the cover shield 160 is disposed.

Referring to FIG. 2, the display device 100 includes a protection plate 110, a display panel 120, a plurality of flexible films 130, a printed circuit board 140, a frame 150, a cover shield 160, heat dissipation fans 170, curvature control members 180, a plurality of panel magnets MG, and a plurality of panel ferromagnetic substances MS. The display device 100 can be configured such that it can be curved by the curvature control members 180. Accordingly, each of the elements of the display device 100 can be made of a flexible material.

The display panel 120 is an element for displaying an image to a user. The display panel 120 can include a display element, circuitry for driving the display element, lines, components, etc. The display element can be defined differently depending on the type of the display panel 120. For example, in the case that the display panel is the organic light-emitting display panel 120, the display element can be an organic light-emitting element including an anode, an organic light-emitting layer, and a cathode. For example, when the display panel 120 is an inorganic light-emitting display panel, the display element can be a light-emitting diode (LED) or a micro LED including an n-type semiconductor layer, a p-type semiconductor layer, and an emissive layer. It is, however, to be understood that the present disclosure is not limited thereto. The display element of the display panel 120 can be implemented in a variety of ways.

The protection plate 110 is disposed on the front surface of the display panel 120. The protection plate 110 can be disposed to cover the display panel 120, and can protect the display panel 120 from external impact, moisture, heat, etc. The protection plate 110 can be made of a material having impact resistance and light transmittance. For example, the protection plate 110 can be a substrate made of glass, or can be a thin film made of a plastic material such as polycarbonate (PC), polyimide (PI), polymethylmethacrylate (PMMA) and polyethylene terephthalate (PET), but the present disclosure is not limited thereto.

A plurality of flexible films 130 is bonded to the rear surface of the display panel 120. Each of the flexible films 130 can be formed by disposing various components on a flexible base film to supply signals to the display element and the circuitry, and can be electrically connected to the display panel 120. The plurality of flexible films 130 can supply a supply voltage, a data voltage, etc. to the display panel 120. Although there are six flexible films 130 which are bonded to the longer side of the display panel 120 in the example shown in FIG. 2, the number and arrangement of the plurality of flexible films 130 are not limited thereto but can vary depending on the design.

Driver integrated circuits (ICs) such as a gate driver IC and a data driver IC can be disposed on the flexible films 130. The driver ICs are elements for processing data for displaying images and processing signals for processing the data. The driver ICs can be disposed by using the chip-on-glass (COG) technique, the chip-on-film (COF) technique, tape carrier package (TCP) technique, etc. Although the driver ICs are mounted on the plurality of flexible films 130 by using the chip-on-film (COF) technique according to the exemplary embodiment of the present disclosure, it is to be understood that the present disclosure is not limited thereto.

The printed circuit board 140 is electrically connected to the plurality of flexible films 130. The printed circuit board 140 is an element for supplying signals to the driver IC. On the printed circuit board 140, a variety of elements for supplying various signals such as driving signals and data signals to the driver IC can be disposed. Although one printed circuit board 140 is shown in FIG. 2, the number of the printed circuit boards 140 is not limited to one but can be variously changed depending on the design choice.

The frame 150 is disposed on the rear surface of the display panel 120. The frame 150 can support and protect the display panel 120 on the rear surface of the display panel 120. The frame 150 can be made of a material having rigidity and can be made of, for example, a metal material such as aluminum (Al), copper (Cu), zinc (Zn), silver (Ag), gold (Au), iron (Fe), SUS (steel use stainless) and invar, or a material such as plastic.

The frame 150 can have a shape conforming to the edges of the display panel 120. For example, the frame 150 can have a frame shape conforming to the edges of the display panel 120. The frame 150 can support the edges of the display panel 120 so that the display panel 120 maintains a flat state. However, the frame 150 can have the same shape as the flat shape of the display panel 120 instead of the frame shape, and the shape of the frame 150 is not limited thereto as long as it can support the display panel 120.

A plurality of panel magnets MG is disposed on the rear surface of the display panel 120. The plurality of panel magnets MG can be fixed to the rear surface of the frame 150 on the rear surface of the display panel 120. The plurality of panel magnets MG is disposed on the rear surfaces of the display panel 120 and the frame 150 and is used to attach the display device 100 to the wall part 200. For example, each of the plurality of panel magnets MG can be a bar-shaped magnet including one N-pole and one S-pole, but the present disclosure is not limited thereto. The plurality of panel magnets MG can be fixed to the frame 150 using an adhesive member or a separate fastening member, but the present disclosure is not limited thereto.

A plurality of panel ferromagnetic substances MS is disposed on the rear surface of the display panel 120. The plurality of panel ferromagnetic substances MS can be fixed to the rear surface of the frame 150 on the rear surface of the display panel 120. The plurality of panel ferromagnetic substances MS can be disposed on the both sides of the plurality of panel magnets MG, respectively. Each of the plurality of panel magnets MG can be disposed between the plurality of panel ferromagnetic substances MS. For example, one of the plurality of panel ferromagnetic substances MS can be in contact with the N-pole of the panel magnet MG, and another one of the panel ferromagnetic substances MS can be in contact with the S-pole of the panel magnet MG. One panel magnet MG can be disposed between two panel ferromagnetic substances MS. The plurality of panel ferromagnetic substances MS can be made of a ferromagnetic substance, for example, can be made of steel, but the present disclosure is not limited thereto.

The display device 100 can be attached to the wall part 200 using the plurality of panel magnets MG and the plurality of panel ferromagnetic substances MS. For example, when the display device 100 is brought into contact with the wall part 200, lines of magnetic force are induced between the wall part 200, the panel magnets MG and the panel ferromagnetic substances MS so that the display device 100 can be fixed to the wall part 200. The plurality of panel ferromagnetic substances MS can be eliminated, and the display device 100 can be attached to the wall part 200 only with the plurality of panel magnets MG. It is to be understood that the way of attaching the display device 100 to the wall part 200 using the plurality of panel magnets MG and the plurality of panel ferromagnetic substances MS is an example, and the present disclosure is not limited thereto. The display device 100 can be attached to the wall part 200 using other fastening members than the panel magnets MG and the panel ferromagnetic substances MS.

The cover shield 160 is disposed on the rear surface of the frame 150. The cover shield 160 can cover the plurality of flexible films 130 and the printed circuit board 140 on the rear surface of the frame 150. Specifically, the plurality of flexible films 130 is bonded to the rear surface of the display panel 120. In this instance, the plurality of flexible films 130 and the printed circuit board 140 may not be disposed between the display panel 120 and the frame 150 but can be disposed to cover the frame 150. Since the plurality of flexible films 130 is films on which various components are disposed on a flexible base film as described above, they can be easily curved. Accordingly, the plurality of flexible films 130 can be curved to cover the frame 150, so that the plurality of flexible films 130 and the printed circuit board 140 can be disposed on the display panel 120 and the frame 150.

The cover shield 160 is disposed to cover the display panel 120, the plurality of flexible films 130, the printed circuit board 140 and the frame 150. Specifically, since the frame 150 does not cover the plurality of flexible films 130 and the printed circuit board 140, it can be difficult to protect the plurality of flexible films 130 and the printed circuit board 140 from external impact. Accordingly, the cover shield 160 can be disposed on the rear surface of the frame 150 to protect the plurality of flexible films 130 and the printed circuit board 140. The cover shield 160 can be disposed to cover the display panel 120, the plurality of flexible films 130, the printed circuit board 140 and the frame 150, to protect the other elements of the display device 100, especially the flexible films 130 and the printed circuit board 140.

The cover shield 160 includes a plurality of first holes 161 exposing the plurality of panel magnets MG and the plurality of panel ferromagnetic substances MS, and a plurality of second holes 162 for heat dissipation.

The plurality of first holes 161 expose the plurality of panel magnets MG and the plurality of panel ferromagnetic substances MS fixed to the rear surface of the frame 150. The plurality of panel magnets MG and the plurality of panel ferromagnetic substances MS exposed through the plurality of first holes 161 can be more closely attached to the wall part 200, and the strength of the lines of magnetic force can increase. If the plurality of panel magnets MG and the plurality of panel ferromagnetic substances MS are covered by the cover shield 160, the cover shield 160 can weaken the strength of the lines of magnetic force because the distance between the wall part 200 and the panel magnets MG and the plurality of panel ferromagnetic substances MS is increased, and thus the display device 100 can be detached from the wall part 200. Accordingly, the plurality of first holes 161 are formed so that the plurality of panel magnets MG and the plurality of panel ferromagnetic substances MS are disposed adjacent to the wall part 200, and the display device 100 can be firmly attached to the wall part 200.

The plurality of second holes 162 can be formed so that they overlap at least the flexible films 130 and the printed circuit board 140. The plurality of second holes 162 are holes for dissipating heat generated from the display device 100 when the display device 100 is driven. In this instance, the plurality of second holes 162 can be disposed to overlap at least the flexible film 130 and the printed circuit board 140, which generate excessive heat, to effectively release heat generated in the display device 100. Although the second holes 162 are located on the upper portion, on the lower portion and the central portion of the cover shield 160 in the example shown in FIG. 2, the locations of the plurality of second holes 162 are not limited thereto.

The heat dissipation fans 170 can be disposed on the rear surface of the display panel 120. The heat dissipation fans 170 can circulate air between the cover shield 160 and the display panel 120 to release heat generated when the display device 100 is driven. Heat in the display device 100 can be released by using the heat dissipation fans 170 to convect the air inside the display device 100. At this time, air can be introduced and discharged through the heat dissipation fans 170 and the plurality of second holes 162 of the cover shield 160. Although four heat dissipation fans 170 are depicted in the example shown in FIG. 2, the heat dissipation fans 170 can be eliminated depending on the design, and the number and arrangement of the heat dissipation fans 170 are not limited thereto.

The curvature control members 180 can be disposed on the inner side of the cover shield 160. The curvature control members 180 can be configured as a bar curved to have a certain curvature. For example, the curvature control members 180 can be implemented as, but is not limited to, an iron core. The curvature control members 180 can be disposed in line with each of the upper edge and the lower edge of the display panel 120, but the present disclosure is not limited thereto. The curvature control members 180 can be coupled to the cover shield 160 by rotation members 185. The curvature control members 180 can be rotated together with the rotation members 185 to switch the cover shield 160 between the first state and the second state.

The curvature control members 180 will be described in detail with reference to FIGS. 3 to 4C.

Figure 3:
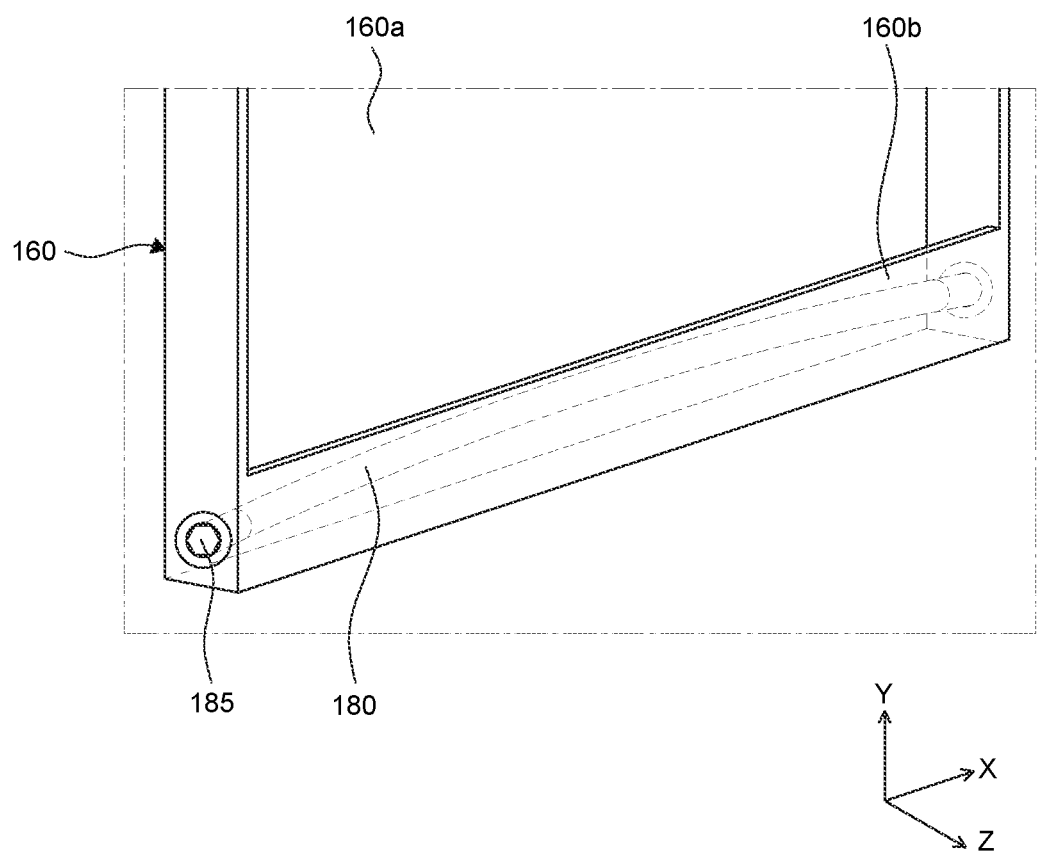
FIG. 3 is a perspective view of a display device according to an exemplary embodiment of the present disclosure.
Figure 4A:
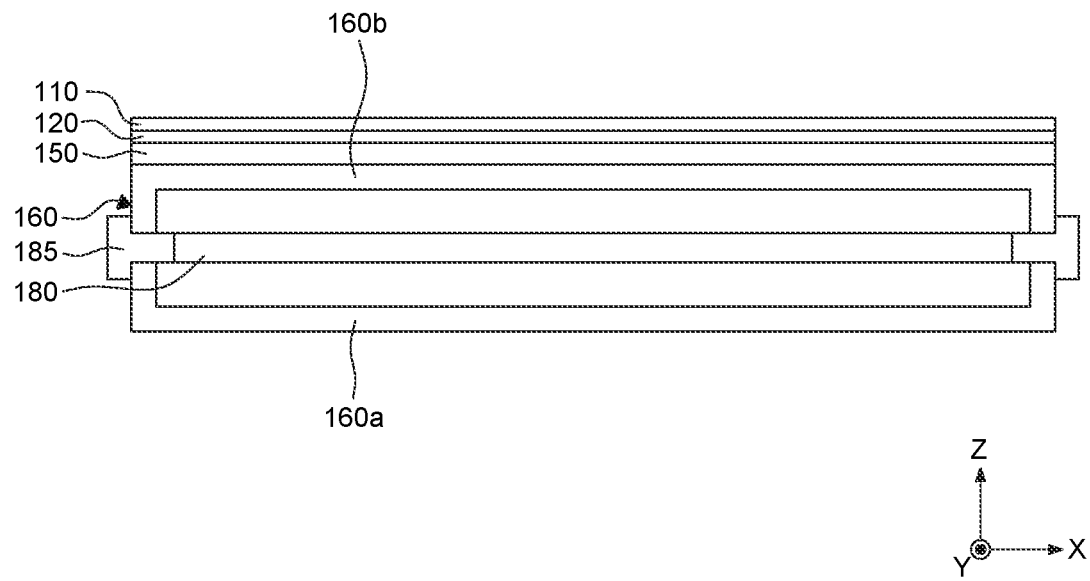
FIGS. 4A to 4C are cross-sectional views of a display device according to an exemplary embodiment of the present disclosure.
Figure 4B:
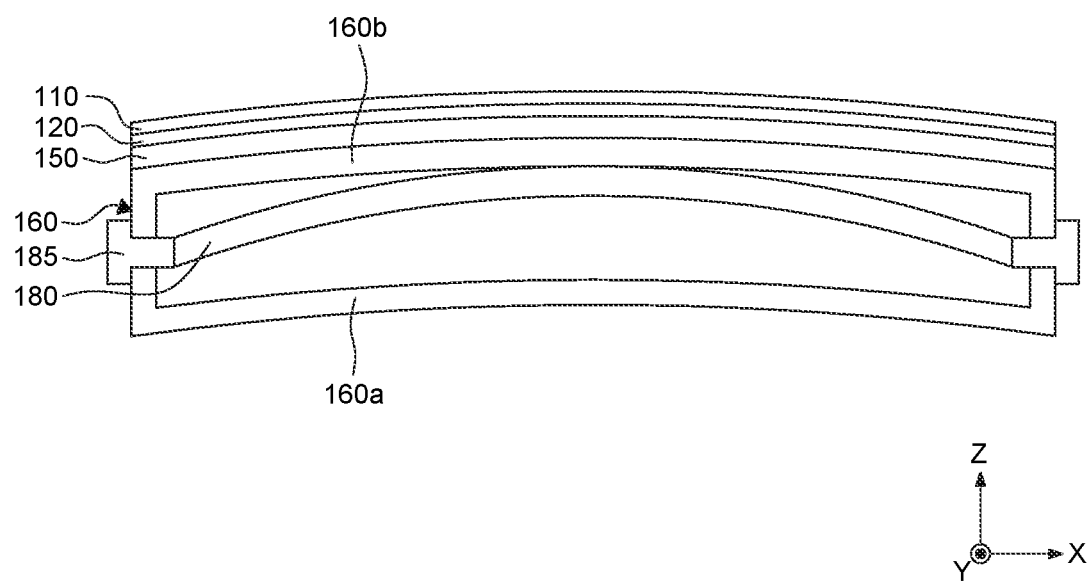

FIG. 3 is a perspective view of a display device according to an exemplary embodiment of the present disclosure. FIGS. 4A to 4C are cross-sectional views of a display device according to an exemplary embodiment of the present disclosure. For convenience of illustration, only the cover shield 160, the curvature control members 180 and the rotation members 185 are schematically shown in FIG. 3. Only the protection plate 110, the display panel 120, the frame 150, the cover shield 160, the curvature control members 180 and the rotation members 185 are schematically shown in FIGS. 4A to 4C. In addition, FIGS. 4A to 4C can be cross-sectional views of the curvature control members 180 of FIG. 3 when viewed from the top. FIGS. 3 and 4A show the first state in which the front surface of the display device 100 is flat. FIGS. 4B and 4C show the second state in which the front surface of the display device 100 is curved.

Figure 4C:
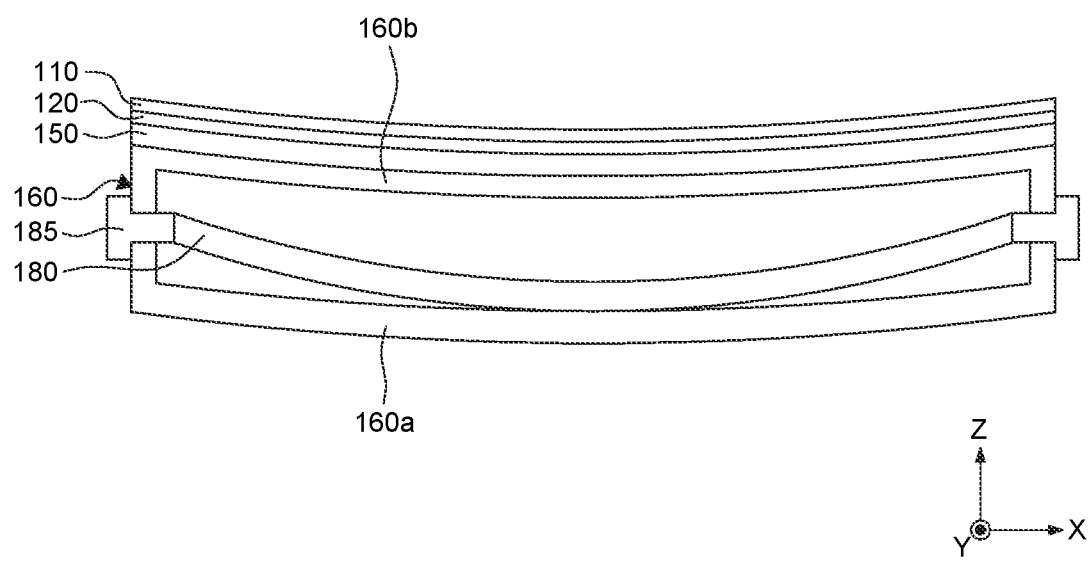

Referring to FIGS. 3 to 4C, the curvature control members 180 are disposed on the inner side of the cover shield 160. Specifically, the curvature control members 180 can be disposed between a first portion 160a and a second portion 160b of the cover shield 160 spaced apart from each other. The first portion 160a can refer to a portion of the cover shield 160 where the holes 161 and 162 and the heat dissipation fans 170 are located, and the second portion 160b can refer to a portion of the cover shield 160 that is adjacent to the frame 150. The first portion 160a and the second portion 160b can be connected with each other by a lower surface and a pair of side surfaces. Accordingly, the cover shield 160 can be formed to have a certain internal space. The area of the second portion 160b can be smaller than the area of the first portion 160a. That is to say, the cover shield 160 can be opened in the area where the second portion 160b is disposed. Since the cover shield 160 has the internal space, air circulation and heat dissipation inside the display device 100 can be facilitated.

The curvature control members 180 can be configured as a bar curved to have a certain curvature. As the curvature control members 180 are formed in a curved shape, the cover shield 160 can be switched to the first state or the second state by rotation of the curvature control members 180. The rotation members 185 can be coupled to one end and the other end of each of the curvature control members 180. The curvature control members 180 can be rotated by the rotation of the rotation members 185. In addition, the rotation members 185 can be respectively fastened to the both side surfaces of the cover shield 160 to couple the cover shield 160 with the curvature control members 180.

Although only the curvature control member 180 disposed at the lower portion of the cover shield 160 is depicted in FIG. 3, the curvature control member 180 disposed at the upper portion can also have the same structure. That is to say, at the upper portion of the cover shield 160, the first portion 160a and the second portion 160b can be connected by an upper surface and a pair of side surfaces. In addition, the curvature control member 180 can be disposed in the space between the first portion 160a and the second portion 160b.

In the first state, the curvature control member 180 and the cover shield 160 are spaced apart from each other. Specifically, referring to FIGS. 3 and 4A, the curvature control member 180 can be spaced apart from the first portion 160a and the second portion 160b of the cover shield 160. At this time, the curvature control member 180 can be curved in the y-axis direction. Specifically, the curvature control member 180 can have an upwardly convex shape. Accordingly, since the convex central portion of the curvature control member 180 are not in contact with the first portion 160a or the second portion 160b, the cover shield 160 can be flat. Although the curvature control member 180 has the upwardly convex shape in the first state in the drawings, the present disclosure is not limited thereto. That is to say, in the first state, the curvature control member 180 can have a downwardly convex shape.

In the second state, the curvature control member 180 and the cover shield 160 are in contact with each other. Specifically, referring to FIGS. 4B and 4C, the curvature control member 180 can be in contact with the first portion 160a or the second portion 160b of the cover shield 160. For example, as shown in FIG. 4B, when the rotation members 185 are rotated toward the second portion 160b in the first state, the convex central portion of the curvature control member 180 can be in contact with the second portion 160b. In addition, the second portion 160b can be curved by a force of the central portion of the curvature control member 180 pressing against the second portion 160b. On the contrary, as shown in FIG. 4C, the convex central portion of the curvature control member 180 can be rotated so that it is in contact with the first portion 160a. In this instance, the first portion 160a can be curved by the force of the central portion of the curvature control member 180 pressing against the first portion 160a. That is to say, a part of the cover shield 160 in contact with the curvature control member 180 can be convexly curved. In addition, when the first portion 160a or the second portion 160b in contact with the curvature control member 180 is curved, the first portion 160a or the second portion 160b not in contact with the curvature control member 180 can be curved together. That is to say, the first portion 160a and the second portion 160b can be curved together in the same direction.

The degree of curving of the cover shield 160 can vary between the minimum curvature and the maximum curvature. In this instance, the minimum curvature and the maximum curvature can be determined depending on the angle formed by the curvature control member 180 and the cover shield 160 when the curvature control member 180 is viewed from the side of the cover shield 160. The side surfaces of the cover shield 160 can refer to the surfaces that connect the first portion 160a with the second portion 160b and coupled to the rotation members 185. In addition, the minimum curvature is 0, when the curvature control member 180 can be spaced apart from the cover shield 160. In addition, when the cover shield 160 has the maximum curvature, the curvature control member 180 can be perpendicular to and in contact with the cover shield 160.

Specifically, when the curvature control member 180 and the cover shield 160 are spaced apart each other, the cover shield 160 can have the minimum curvature. When the curvature control member 180 come into contact with the first portion 160a or the second portion 160b as it rotates, the cover shield 160 can have a curvature greater than zero. Right after the curvature control member 180 and the cover shield 160 are brought into contact with each other, the curvature control member 180 can be in contact with the first portion 160a or the second portion 160b such that it is obliquely inclined. In addition, when the curvature control member 180 is in contact with the first portion 160a or the second portion 160b such that it is perpendicular to them, the cover shield 160 can be curved with the maximum curvature. The curvature of the cover shield 160 can vary by the rotation of the curvature control member 180 between the minimum and maximum curvatures.

The display device 100 can be curved so that its curvature is equal to the curvature of the cover shield 160. That is to say, as the cover shield 160 is curved, the frame 150, the display panel 120 and the protection plate 110 can be curved together. In this manner, the curvature of the display device 100 can be controlled conveniently by rotating the curvature control member 180 and the rotation member 185.

Since the tiled display includes a plurality of display devices, it is important to prevent the boundary areas between the plurality of display devices, on which an image is not displayed, from being seen by a user. When a tiled display has a flat structure, it is possible to suppress the boundary areas from being noticed by disposing the display devices to reduce the level differences between them in the x-axis, y-axis, and z-axis directions. However, for a curved tiled display formed by connecting a plurality of flat panel display devices, the boundary areas between the flat display devices can be angled. Accordingly, the boundary areas between the display devices can be seen by a user. Such boundary areas disturb the user's immersion into the images, and it can be difficult to realize clear images.

In view of the above, the display device 100 according to an exemplary embodiment can be curved by virtue of the curvature control members 180 and the rotation members 185 having the simple structure. That is to say, the curvature control member 180 can have a curvature, and the rotation members 185 can rotate the curvature control member 180. When the curvature control member 180 is rotated and brought into contact with the cover shield 160, the curved central portion of the curvature control member 180 presses the contact area of the cover shield 160, and thus the cover shield 160 can be bent so that the contact area of the cover shield 160 convexly protrudes. In addition, as the cover shield 160 is curved, the display device 100 can be curved together. That is to say, the display device 100 can be switched from a flat surface to a curved surface with the simple structure.

In addition, the curvature of the display device 100 can be easily changed by a simple operation. That is to say, the curvature of the display device 100 can be easily changed according to the rotation of the rotation members 185 and the curvature control member 180. Specifically, the angle formed by the curvature control member 180 and the cover shield 160 can be changed according to the rotation of the curvature control member 180. In addition, the curvature of the display device 100 can vary between the minimum curvature and the maximum curvature according to the angle formed by the curvature control member 180 and the cover shield 160. That is to say, it is possible to adjust the display device 100 according to the exemplary embodiment of the present disclosure so that a desired curvature is obtained by simply rotating the curvature control member 180 with the rotation members 185.

The tiled display 1000 having various curvatures can be implemented using the display devices 100 according to the exemplary embodiment of the present disclosure. That is to say, since the curvature of the display device 100 is variable, it can be applied to the tiled display 1000 having various curvatures. The tiled display 1000 can be formed such that all of the front surfaces of the plurality of display devices 100 can form a single curved surface. That is to say, the curvature of each of the display devices 100 can be easily controlled so that the curved surfaces formed by the plurality of display devices 100 are continuous. Accordingly, in the tiled display 1000, it is possible to avoid the boundary areas between the plurality of display devices 100 from being seen, and thus the display quality can be improved.

Figure 5A:
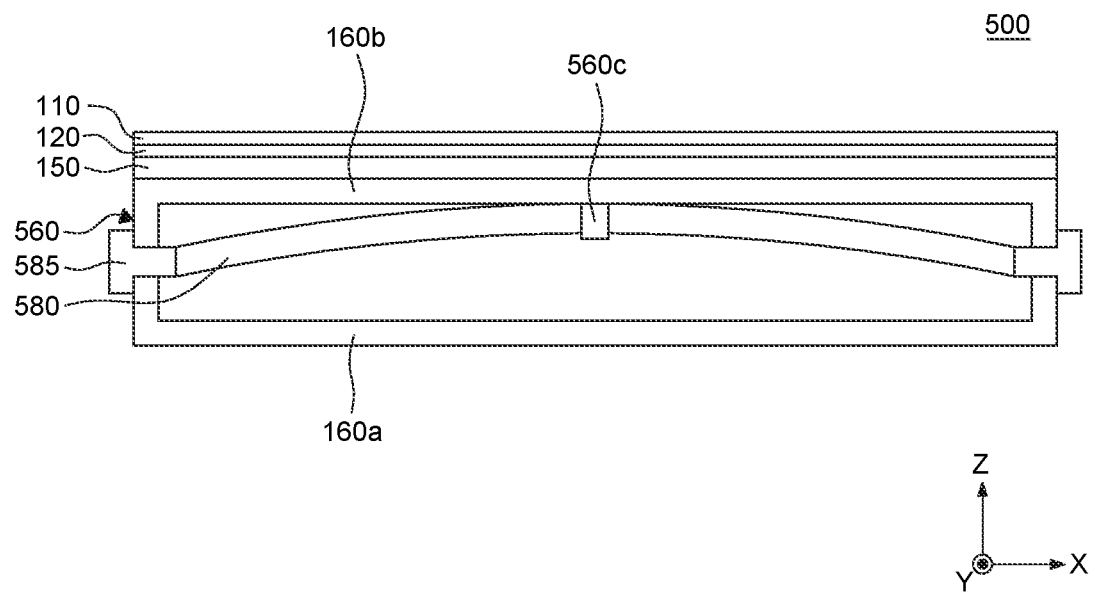
FIGS. 5A to 5C are cross-sectional views of a display device according to another exemplary embodiment of the present disclosure.
Figure 5B:
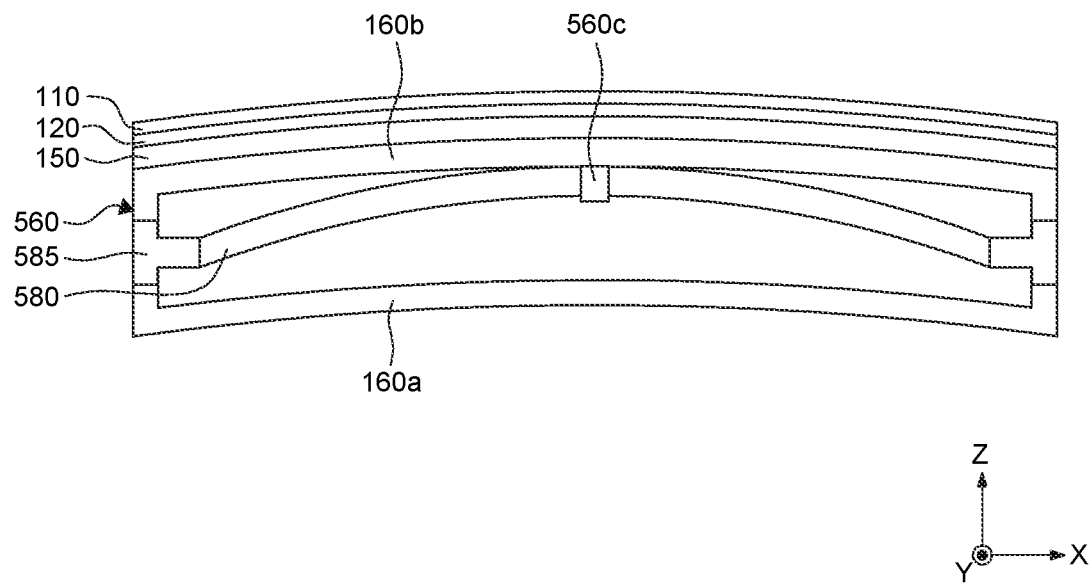
Figure 5C:
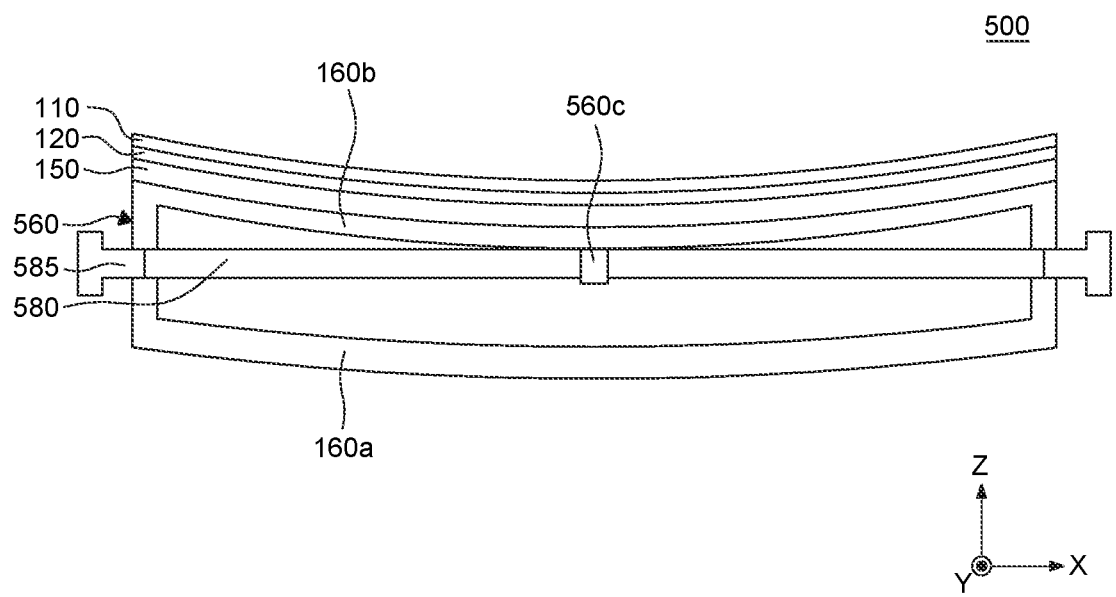

FIGS. 5A to 5C are cross-sectional views of a display device according to another exemplary embodiment of the present disclosure. FIG. 5A shows the first state in which the front surface of the display device 500 is flat. FIGS. 5B and 5C show the second state in which the front surface of the display device 500 is curved. In particular, FIG. 5B shows an example in which rotation members 585 are maximally rotated in a first direction, and FIG. 5C shows an example in which the rotation members 585 are maximally rotated in a second direction. A display device 500 shown in FIGS. 5A to 5C is substantially identical to the display device 100 shown in FIGS. 2 to 4 except for a cover shield 560 and a curvature control member 580 and, therefore, the redundant description will be omitted or may be briefly provided.

Referring to FIGS. 5A to 5C, the curvature control member 580 is disposed on the inner side of the cover shield 560. Specifically, the curvature control member 580 can be disposed between a first portion 160a and a second portion 160b of the cover shield 560 spaced apart from each other. In addition, the curvature control member 580 can be fixed to the second portion 160b by a fixing member 560c. Specifically, the cover shield 560 can include the fixing member 560c, and the fixing member 560c can fix the central portion of the curvature control member 580 to the second portion 160b. Although the curvature control member 580 is in contact with the second portion 160b by the fixing member 560c in the drawings, the present disclosure is not limited thereto. That is to say, the curvature control member 580 can be fixed to the second portion 160b by the fixing member 560c such that it is spaced apart from the second portion 160b.

The curvature control member 580 can be configured as a bar bent to have a certain curvature. For example, the curvature control members 580 can be implemented as, but is not limited to, an iron core. The rotation members 585 can be coupled to one end and the other end of the curvature control members 580, respectively. The rotation members 585 can be implemented as, for example, bolts. The rotation members 585 can move toward the inner side of the cover shield 560 as it rotates in the first direction, and can move toward the outside of the cover shield 560 as it rotates in the second direction. The curvature control member 580 can be rotated by the rotation of the rotation members 585. In addition, the rotation members 585 can be respectively fastened to the both side surfaces of the cover shield 560 to couple the cover shield 560 with the curvature control member 580. Accordingly, as the curvature control member 580 and the rotation members 585 rotate, the cover shield 560 can be switched between the first state and the second state.

The degree and direction of curving of the curvature control member 580 can vary according to the rotation direction of the rotation members 585. For example, when the curvature control member 580 rotates in the first direction, the curvature control member 580 can be curved toward the display panel 120. In addition, when the curvature control member 580 is rotated in the second direction, the curvature control member 580 can be unfolded (e.g., straightened or flattened with no or minimum curvature). The first direction can refer to a clockwise direction, and the second direction can refer to a counterclockwise direction, or vice versa.

As shown in FIG. 5A, in the first state, the cover shield 560 can have a flat state without being curved. The curved central portion of the curvature control member 580 is fixed to the second portion 160b by the fixing member 560c.

As shown in FIG. 5B, as the rotation members 585 rotates in the first direction, the curvature control member 580 can be curved toward the display panel 120. That is to say, the rotation members 585 coupled to the both ends of the curvature control member 580, respectively, can rotate in the first direction to compress the curvature control member 580. As a result, the curvature control member 580 can be curved in a direction toward the display panel 120. Since the curvature control member 580 is fixed to the second portion 160b, the curvature control member 580 is curved and simultaneously presses the second portion 160b. Accordingly, the second portion 160b can be curved by a force of the central portion of the curvature control member 580 pressing against the second portion 160b. In other words, when the rotation members 585 are rotated maximally in the first direction, the cover shield 560 can be curved convexly toward the display panel 120.

As shown in FIG. 5C, as the rotation member 585 is rotated in the second direction, the curvature control member 580 can be unfolded (e.g., straightened or flattened with no or minimum curvature). That is to say, the rotation members 585 coupled to the both ends of the curvature control member 580, respectively, can rotate in the second direction to pull apart the curvature control member 580. Accordingly, the curved curvature control member 580 can be unfolded and the curvature is reduced, and finally, the curved curvature control member 580 can become flat. Since the curvature control member 580 is fixed to the second portion 160b, the curvature control member 580 is unfolded and pulls the second portion 160b. Accordingly, the second portion 160b can be curved in the direction away from the display panel 120 by the force of the central portion of the curvature control member 580 pulling the second portion 160b. In other words, when the rotation members 585 are rotated maximally in the second direction, the cover shield 560 can be curved convexly away from the display panel 120.

The curvature of the curvature control member 580 can vary between a state in which the rotation members 585 are rotated maximally in the first direction and a state in which the rotation members 585 are rotated maximally in the second direction. That is to say, when the rotation members 585 are rotated maximally in the first direction, the curvature control member 580 can be curved to have the maximum curvature. In addition, when the rotation members 585 are rotated maximally in the second direction, the curvature control member 580 can be unfolded to have the minimum curvature. At this time, the minimum curvature of the curvature control member 580 is 0, and the curvature control member 580 can become flat. In addition, the curvature and curving direction of the cover shield 560 can vary between the state in which the curvature control member 580 has the maximum curvature and the state in which the curvature control member 580 has the minimum curvature.

Specifically, when the curvature control member 580 has the maximum curvature, the cover shield 560 can have the maximum curvature in the direction toward the display panel 120. As the curvature of the curvature control member 580 becomes smaller than the maximum curvature, the curvature of the cover shield 560 can also become smaller. In addition, when the curvature of the curvature control member 580 becomes a certain initial curvature, the cover shield 560 can have the minimum curvature. At this time, the minimum curvature is 0, when the cover shield 560 can have an initial flat state. In addition, as the curvature of the curvature control member 580 becomes smaller than the initial curvature, the curvature of the cover shield 560 can increase again. That is to say, as the curvature control member 580 is unfolded, the curvature of the cover shield 560 can increase and can be curved in the direction away from the display panel 120. In addition, when the curvature control member 580 has the minimum curvature, the cover shield 560 can have the maximum curvature in the direction away from the display panel 120.

The display device 500 can be curved so that its curvature is equal to the curvature of the cover shield 560. That is to say, as the cover shield 560 is curved, the frame 150, the display panel 120 and the protection plate 110 can be curved together. In this manner, the curvature of the display device 500 can be controlled conveniently by rotating the curvature control member 580 and the rotation member 585. In addition, the display device 500 can be applied to a tiled display having various curvatures. All of the front surfaces of the plurality of display devices 500 forming the tiled display can form a single curved surface. Accordingly, in the tiled display, it is possible to suppress the boundary areas between the plurality of display devices from being noticed, and the display quality can be improved.

Figure 6:
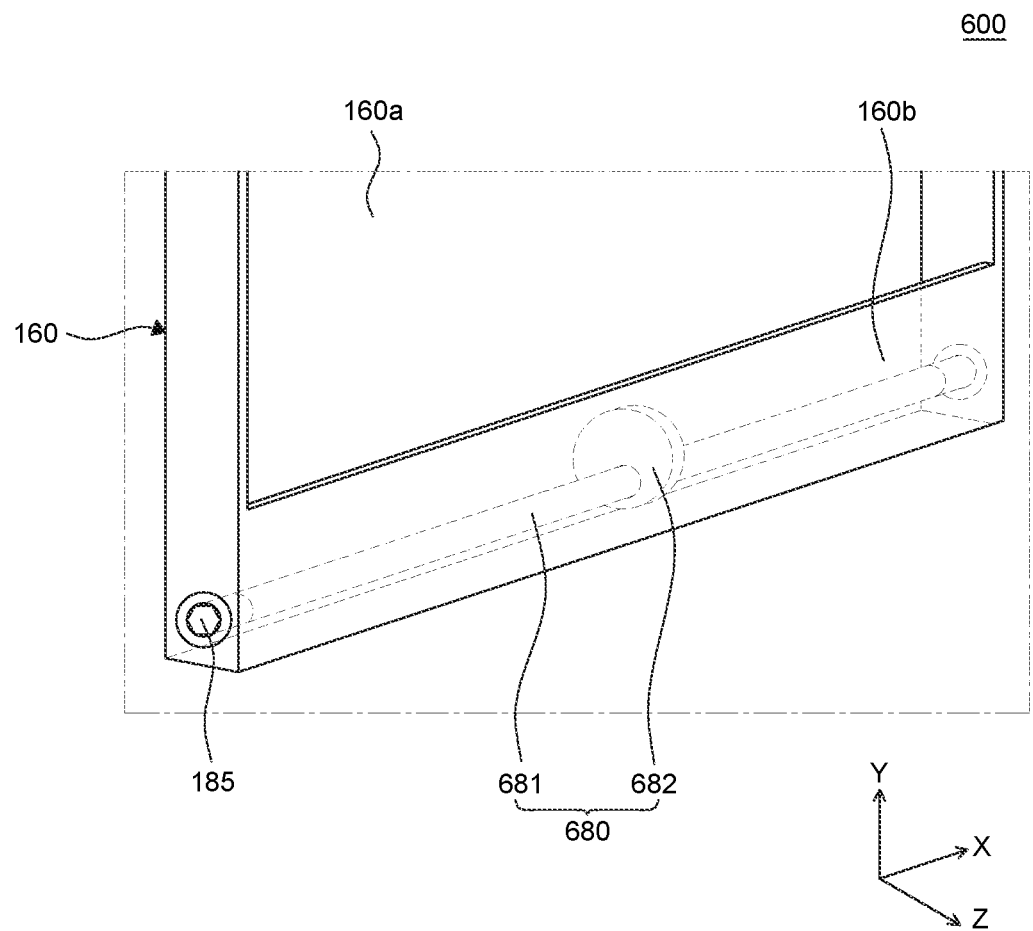
FIG. 6 is a perspective view of a display device according to yet another exemplary embodiment of the present disclosure.
Figure 7A:
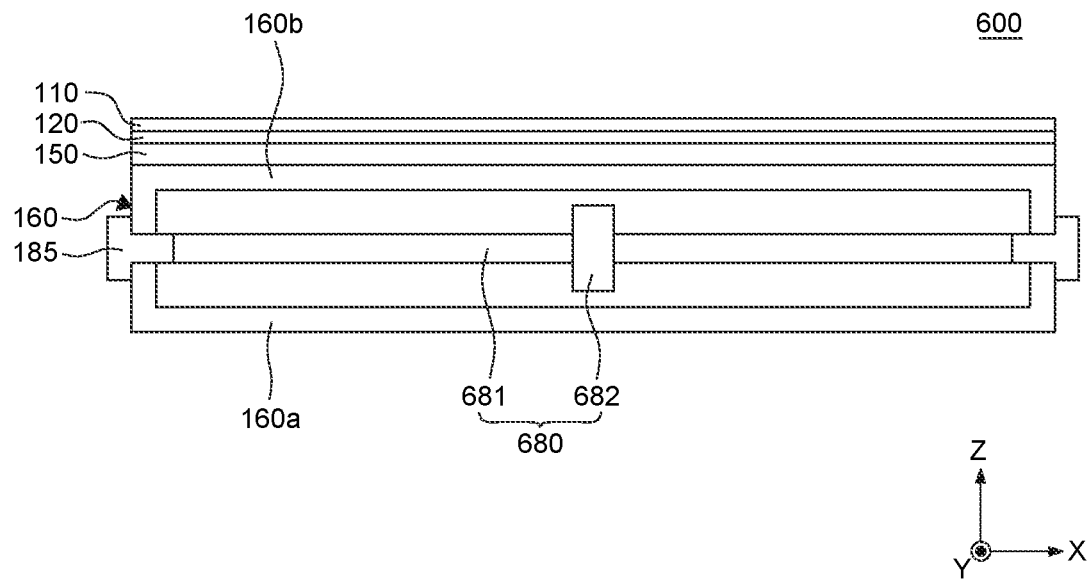
FIGS. 7A to 7C are cross-sectional views of a display device according to yet another exemplary embodiment of the present disclosure.
Figure 7B:
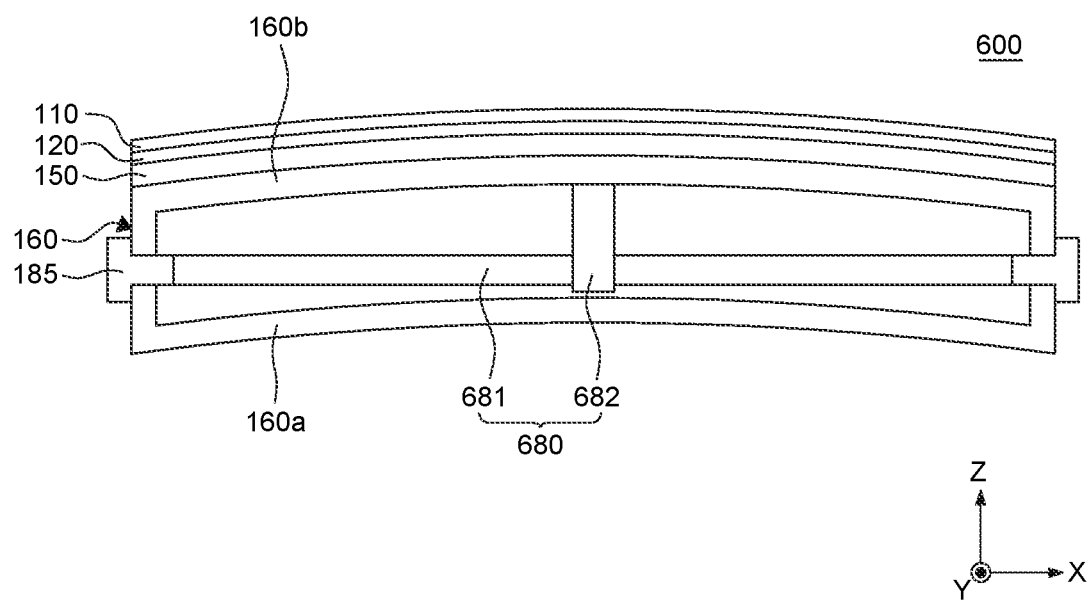
Figure 7C:
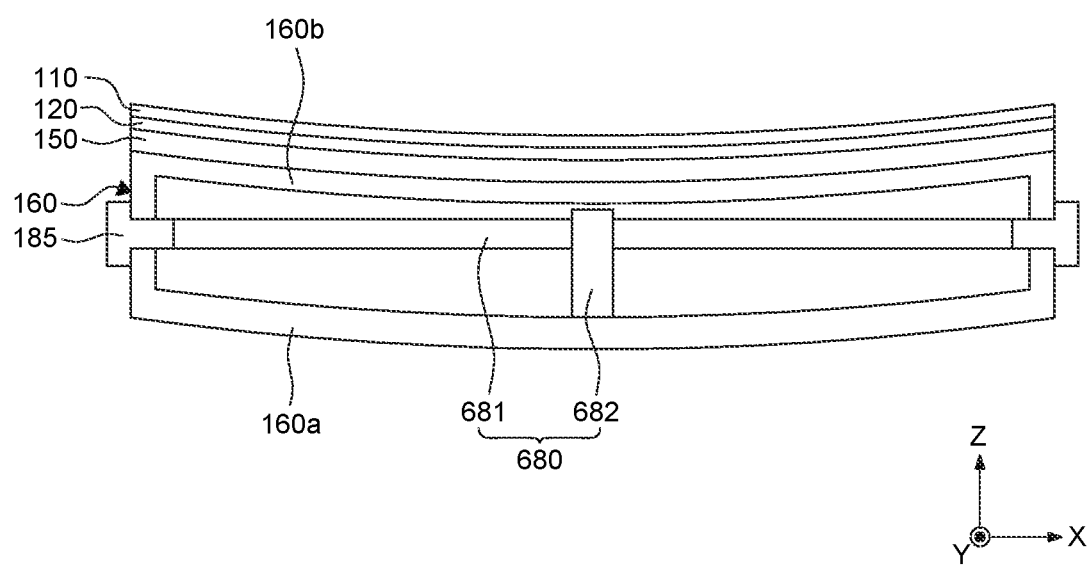

FIG. 6 is a perspective view of a display device according to yet another exemplary embodiment of the present disclosure. FIGS. 7A to 7C are cross-sectional views of a display device according to yet another exemplary embodiment of the present disclosure. For convenience of illustration, only the cover shield 160, the curvature control member 680 and the rotation member 185 are schematically shown in FIG. 6. FIGS. 6 and 7A show the first state in which the front surface of the display device 600 is flat. FIGS. 7B and 7C show the second state in which the front surface of the display device 600 is curved. The display device 600 shown in FIGS. 6 to 7C is substantially identical to the display device 100 shown in FIGS. 2 to 4C except for a curvature control member 680 and, therefore, the redundant description will be omitted or may be briefly provided.

Referring to FIGS. 6 to 7C, the curvature control member 680 is disposed on the inner side of the cover shield 160. Specifically, the curvature control members 680 can be disposed between a first portion 160a and a second portion 160b of the cover shield 160 spaced apart from each other. The rotation members 185 can be coupled to one end and the other end of each of the curvature control members 680. The curvature control member 680 can be rotated by the rotation of the rotation members 185. In addition, the rotation members 185 can be respectively fastened to the both side surfaces of the cover shield 160 to couple the cover shield 160 with the curvature control member 680. As the curvature control member 680 and the rotation members 185 rotate, the cover shield 160 can be switched between the first state and the second state.

The curvature control member 680 includes a bar 681 curved to have a certain curvature and an eccentric plate 682 coupled to the bar 681. The bar 681 can be implemented as, but is not limited to, a curved iron core. Rotation members 185 can be coupled to both ends of the bar 681, respectively. The eccentric plate 682 can be fixed to the central portion of the bar 681. The eccentric plate 682 can be formed as a circular plate. The curvature control member 680 can have an eccentric structure. Specifically, the bar 681 and the eccentric plate 682 can be coupled such that the center axis of the bar 681 and the center of the eccentric plate 682 are spaced apart from each other. The center axis of the bar 681 can refer to a rotation axis, and the center of the eccentric plate 682 can refer to the center of a circle.

In the first state, the curvature control member 680 and the cover shield 160 are spaced apart from each other. Specifically, referring to FIGS. 6 and 7A, the eccentric plate 682 of the curvature control member 680 can be spaced apart from the first portion 160a and the second portion 160b of the cover shield 160. The end of the eccentric plate 682 farthest from the center axis of the bar 681 can be disposed in the y-axis direction. Hereinafter, for convenience of illustration, an end of end regions forming the circumference of the eccentric plate 682 which is farthest from the center axis of the bar 681 will be defined as a protrusion. Since the protrusion is not in contact with the first portion 160*a* and the second portion 160*b*, the cover shield 160 can be flat.

In the second state, the curvature control member 680 and the cover shield 160 are in contact with each other. Specifically, referring to FIGS. 7B and 7C, the eccentric plate 682 of the curvature control member 680 can be in contact with the first portion 160*a* or the second portion 160*b*. For example, as shown in FIG. 7B, the protrusion of the eccentric plate 682 and the second portion 160*b* can come into contact with each other by the rotation of the rotation members 185. In addition, the second portion 160*b* can be curved by the force of the protrusion of the eccentric plate 682 pressing against the second portion 160*b*. On the contrary, as shown in FIG. 7C, the protrusion of the eccentric plate 682 and the first portion 160*a* can come into contact with each other by the rotation of the rotation members 185. In addition, the first portion 160*a* can be curved by the force of the protrusion of the eccentric plate 682 pressing against the first portion 160*a*. That is to say, the portion of the cover shield 160 in contact with the eccentric plate 682 of the curvature control member 680 can be convexly curved. In addition, when the first portion 160*a* or the second portion 160*b* in contact with the eccentric plate 682 is curved, the first portion 160*a* or the second portion 160*b* not in contact with the eccentric plate 682 can be curved together. That is to say, the first portion 160*a* and the second portion 160*b* can be curved together in the same direction.

The degree of curving of the cover shield 160 can vary between the minimum curvature and the maximum curvature. The minimum curvature and the maximum curvature can be determined based on the angle between the imaginary line connecting the center axis of the bar 681 with the protrusion of the eccentric plate 682 and the first portion 160*a* or the second portion 160*b*. The minimum curvature is 0, when the curvature control member 680 can be spaced apart from the cover shield 160. When the cover shield 160 has the maximum curvature, the imaginary line and the cover shield 160 can be perpendicular to each other.

Specifically, when the curvature control member 680 and the cover shield 160 are spaced apart each other, the cover shield 160 can have the minimum curvature. When the curvature control member 680 come into contact with the first portion 160*a* or the second portion 160*b* as it rotates, the cover shield 160 can have a curvature greater than zero. Right after the curvature control member 680 and the cover shield 160 are brought into contact with each other, the imaginary line can be in contact with the first portion 160*a* or the second portion 160*b* such that it is obliquely inclined. In addition, when the imaginary line is perpendicular to the first portion 160*a* or the second portion 160*b*, the cover shield 160 can be curved with the maximum curvature. The curvature of the cover shield 160 can vary by the rotation of the curvature control member 680 between the minimum and maximum curvatures.

The display device 600 can be curved so that its curvature is equal to the curvature of the cover shield 160. That is to say, as the cover shield 160 is curved, the frame 150, the display panel 120 and the protection plate 110 can be curved together. In this manner, the curvature of the display device 600 can be controlled conveniently by rotating the curvature control member 680 and the rotation member 185.

The exemplary embodiments of the present disclosure can also be described as follows.

According to an aspect of the present disclosure, a display device includes a display panel, a cover shield disposed on a rear surface of the display panel, a curvature control member disposed on an inner side of the cover shield and rotation members connected to both ends of the curvature control member, respectively, and coupling the cover shield with the curvature control member, wherein the curvature control member is configured to rotate with the rotation members, and wherein the cover shield is switched between a first state and a second state as the curvature control member rotates, wherein the cover shield is flat in the first state and is curved with a curvature in the second state.

The display panel can be configured to be curved along with the cover shield in the second state.

The curvature control member can be implemented as a bar curved with a curvature in the first state.

The curvature control member and the cover shield can be spaced apart from each other in the first state, and a central portion of the curvature control member and the cover shield can be in contact with each other in the second state.

The portion of the cover shield in contact with the curvature control member can be convexly curved in the second state.

A central portion of the curvature control member can be fixed to an inner surface of the cover shield.

The curvature control member can be configured to be curved toward the display panel when the rotation members are rotated in a first direction, and the curvature control member can be configured to be unfolded when the rotation members are rotated in a second direction.

The cover shield can be convexly curved toward the display panel when the rotation members are rotated maximally in the first direction, and the cover shield can be configured to be convexly curved away from the display panel when the rotation members are rotated maximally in the second direction.

The curvature control member can include a bar coupled to the rotating members and an eccentric plate fixed to a center of the bar, and a center axis of the bar and a center of the eccentric plate can be spaced apart from each other.

The eccentric plate and the cover shield can be spaced apart from each other in the first state, and the eccentric plate and the cover shield can be in contact with each other in the second state.

A portion of the cover shield in contact with the eccentric plate can be convexly curved in the second state.

The curvature control member can be disposed at each of an upper portion and a lower portion of the display panel.

According to an aspect of the present disclosure, a display device includes a display panel, a cover shield disposed on a rear surface of the display panel, a curvature control member disposed on an inner side of the cover shield such that it is disposed at each of an upper portion and a lower portion of the display panel and rotation members connected to both ends of the curvature control member, respectively, and rotating together with the curvature control member, wherein the display panel and the cover shield are switched between a first state and a second state as the curvature control member rotates, wherein the display panel and the cover shield are flat in the first state and are curved with a curvature in the second state.

The curvature control member can include a bar coupled to the rotating members and an eccentric plate fixed to a center of the bar and a center axis of the bar and a center of the eccentric plate can be spaced apart from each other.

The eccentric plate and the cover shield can be spaced apart from each other in the first state, and the eccentric plate and the cover shield can be in contact with each other in the second state.

The curvature control member can be implemented as a bar curved with a curvature in the first state.

The curvature control member and the cover shield can be spaced apart from each other in the first state, and a central portion of the curvature control member and the cover shield can be in contact with each other in the second state.

A central portion of the curvature control member can be fixed to an inner surface of the cover shield.

The curvature control member can be configured to be curved toward the display panel when the rotation members are rotated in a first direction and the curvature control member can be configured to be unfolded when the rotation members are rotated in a second direction.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
   a display panel;
   a cover shield disposed on a rear surface of the display panel;
   a curvature control member disposed on an inner side of the cover shield; and
   rotation members connected to ends of the curvature control member, respectively, and coupling the cover shield with the curvature control member,
   wherein the curvature control member is configured to rotate with the rotation members,
   wherein the cover shield is switched between a first state and a second state as the curvature control member rotates, and the cover shield is configured to be flat in the first state and is configured to be curved with a curvature in the second state,
   wherein the curvature control member is implemented as a bar curved with a curvature in the first state,
   wherein the curvature control member and the cover shield are spaced apart from each other in the first state, and
   wherein a central portion of the curvature control member and the cover shield are in contact with each other in the second state.

2. The display device of claim 1, wherein the display panel is configured to be curved along with the cover shield in the second state.

3. The display device of claim 1, wherein a portion of the cover shield in contact with the curvature control member is convexly curved in the second state.

4. The display device of claim 1, wherein the central portion of the curvature control member is fixed to an inner surface of the cover shield.

5. The display device of claim 4, wherein the curvature control member is configured to be curved toward the display panel when the rotation members are rotated in a first direction, and
   wherein the curvature control member is configured to be unfolded when the rotation members are rotated in a second direction different from the first direction.

6. The display device of claim 4, wherein the cover shield is convexly curved toward the display panel when the rotation members are rotated maximally in a first direction, and
   wherein the cover shield is configured to be convexly curved away from the display panel when the rotation members are rotated maximally in a second direction different from the first direction.

7. The display device of claim 1, wherein the curvature control member comprises:
   a bar coupled to the rotation members; and
   an eccentric plate fixed to a center of the bar, and
   wherein a center axis of the bar and a center of the eccentric plate are spaced apart from each other.

8. The display device of claim 7, wherein the eccentric plate and the cover shield are spaced apart from each other in the first state, and
   wherein the eccentric plate and the cover shield are in contact with each other in the second state.

9. The display device of claim 8, wherein a portion of the cover shield in contact with the eccentric plate is convexly curved in the second state.

10. The display device of claim 1, wherein the curvature control member is disposed at each of an upper portion and a lower portion of the display panel.

11. A display device, comprising:
    a display panel;
    a cover shield disposed on a rear surface of the display panel;
    a curvature control member disposed on an inner side of the cover shield so that the curvature control member is disposed at each of an upper portion and a lower portion of the display panel; and
    rotation members connected to ends of the curvature control, respectively, which are configured to rotate together with the curvature control member,
    wherein the display panel and the cover shield are switched between a first state and a second state as the curvature control member rotates, and the display panel and the cover shield are configured to be flat in the first state and are configured to be curved with a curvature in the second state,
    wherein the curvature control member is implemented as a bar curved with a curvature in the first state,
    wherein the curvature control member and the cover shield are spaced apart from each other in the first state, and
    wherein a central portion of the curvature control member and the cover shield are in contact with each other in the second state.

12. The display device of claim 11, wherein the curvature control member comprises:
    a bar coupled to the rotation members; and
    an eccentric plate fixed to a center of the bar, and
    wherein a center axis of the bar and a center of the eccentric plate are spaced apart from each other.

13. The display device of claim 12, wherein the eccentric plate and the cover shield are spaced apart from each other in the first state, and wherein the eccentric plate and the cover shield are in contact with each other in the second state.

14. The display device of claim 13, wherein the central portion of the curvature control member is fixed to an inner surface of the cover shield.

15. The display device of claim 14, wherein the curvature control member is configured to be curved toward the display panel when the rotation members are rotated in a first direction, and wherein the curvature control member is configured to be unfolded when the rotation members are rotated in a second direction different from the first direction.

* * * * *